United States Patent [19]

Maurer et al.

[11] 3,934,123

[45] Jan. 20, 1976

[54] EVENT RECORDER WITH CODED REMOVABLE DISPLAY

[75] Inventors: Gottfried Maurer, Needham; Patrick S. Harris, Medfield; Wayne H. Ledder, Medway, all of Mass.

[73] Assignee: Viable Systems, Inc., Needham, Mass.

[22] Filed: Feb. 11, 1974

[21] Appl. No.: 441,454

[52] U.S. Cl...... 235/92 PD; 235/92 CT; 235/92 EA; 235/92 R

[51] Int. Cl.[2] ..................... G07C 3/10; H03K 21/18

[58] Field of Search....... 235/92 CT, 92 PD, 92 EA, 235/92 FL; 340/334, 336

[56] References Cited

UNITED STATES PATENTS

| | | | |
|---|---|---|---|
| 3,551,652 | 12/1970 | Faude | 235/92 CT |
| 3,754,122 | 8/1973 | Dinapoli et al. | 235/92 R |
| 3,755,806 | 8/1973 | Bunting | 235/92 EA |
| 3,779,357 | 12/1973 | Haller et al. | 235/92 CT |

*Primary Examiner*—Joseph M. Thesz, Jr.
*Attorney, Agent, or Firm*—Richard L. Stevens

[57] ABSTRACT

An event recorder which includes a plurality of counters. An interface circuit is provided between the event recorder and a machine, the events of which are to be monitored. Signals corresponding to machine events are accumulated on the counters. A separate display unit having a connector mating with the event recorder is mated with the event recorder and the status of the counters is transferred to the display unit and displayed.

5 Claims, 3 Drawing Figures

FIG. 1
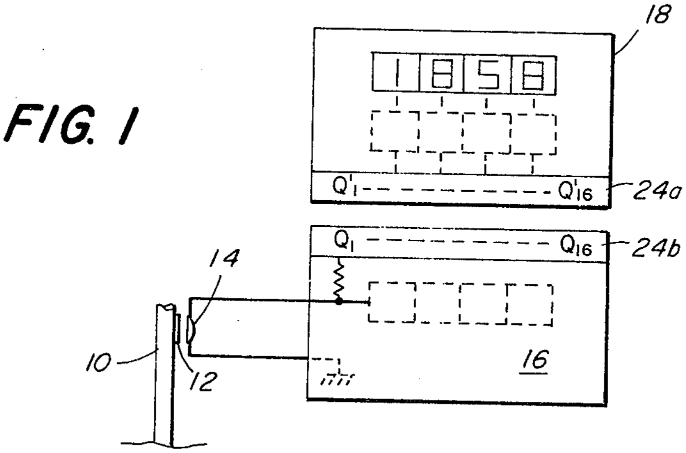
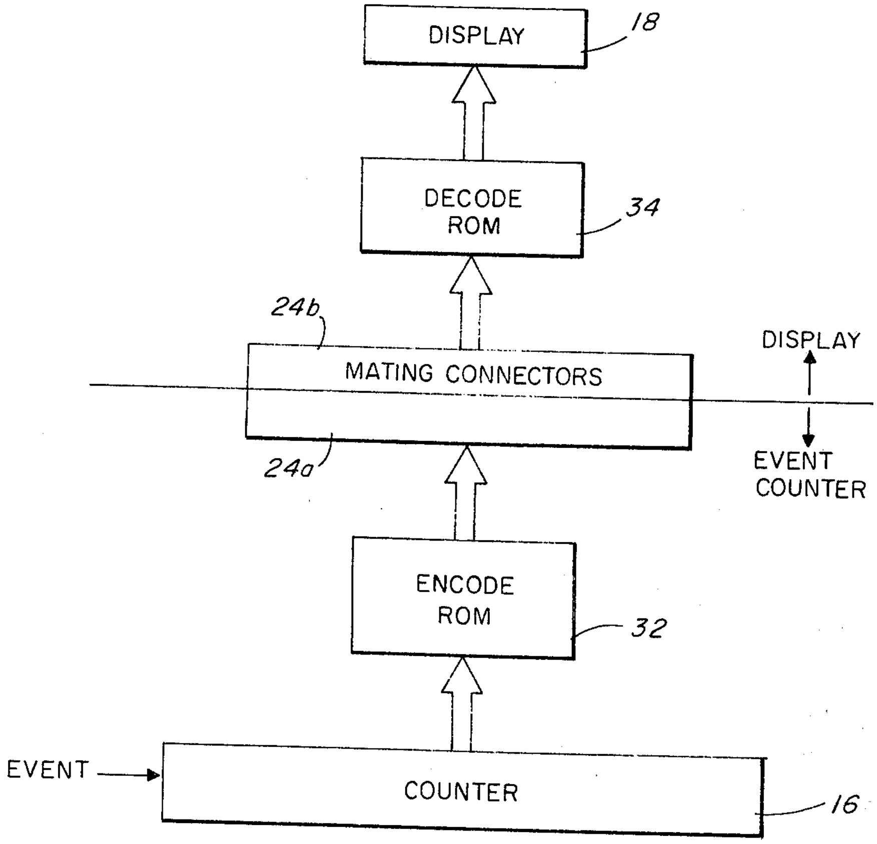
FIG. 3

EVENT RECORDER WITH CODED REMOVABLE DISPLAY

BACKGROUND OF THE INVENTION

Various types of machines perform a repetitive function or number of events and in some instances, such as where the machine is leased, it is necessary to determine or record the number of events the machine performs. Most commonly employed recorders or monitors are mechanical counters which normally have a decimal display. These mechanical counters are normally expensive, need approximately ½ inch on an actuating arm to function or they require a solenoid relay to drive them. Also, they are subject both to "skimming" where the counter is by-passed and events are not recorded, and tampering, where the counter itself is tampered with to modify readings.

Thus, there exists a need for an electronic counter which does not rely on mechanical movement of any of the machine parts to record events. Further, the counter should accumulate counts internally and the counts should be displayed only when a compatible display unit is mated with the counter.

SUMMARY OF THE INVENTION

The invention is broadly directed to a method and apparatus for monitoring a discrete number of events. More particularly, the invention embodies a recorder to count a plurality of events performed by a machine. The invention in one embodiment includes a count recorder adapted to interface with and is responsive to a signal from the machine and includes a display unit removably mated with the count recorder.

In the preferred embodiment of the invention, an electronic recorder is provided and includes an interface circuit to insure that the signal derived from the machine is compatible with the recorder. The signal is related to the events to be recorded and the number of events counted are coded and stored in the recorder. To determine the number of counts stored in the recorder a display unit is placed in electrical communication with the recorder. The display unit essentially is a portable circuit with decoders. The circuit is compatible with the circuit of the recorder and the state of the counter is displayed when desired.

In a further aspect of the invention, the display unit is keyed to function only with a certain recorder(s). For example, unique codes may be devised requiring a specific decoder to be used in the display unit. Alternatively, standard codes may be used, but the mating connection between the recorder and the display unit may be scrambled. Also, combinations of special codes and scrambled connections may be used.

BRIEF DESCRIPTION OF THE DRAWINGS

FIG. 1 is a schematic illustration of the invention;

FIG. 3 is a schematic illustration of an alternative embodiment of the invention.

DESCRIPTION OF THE PREFERRED EMBODIMENT

Figure 2:
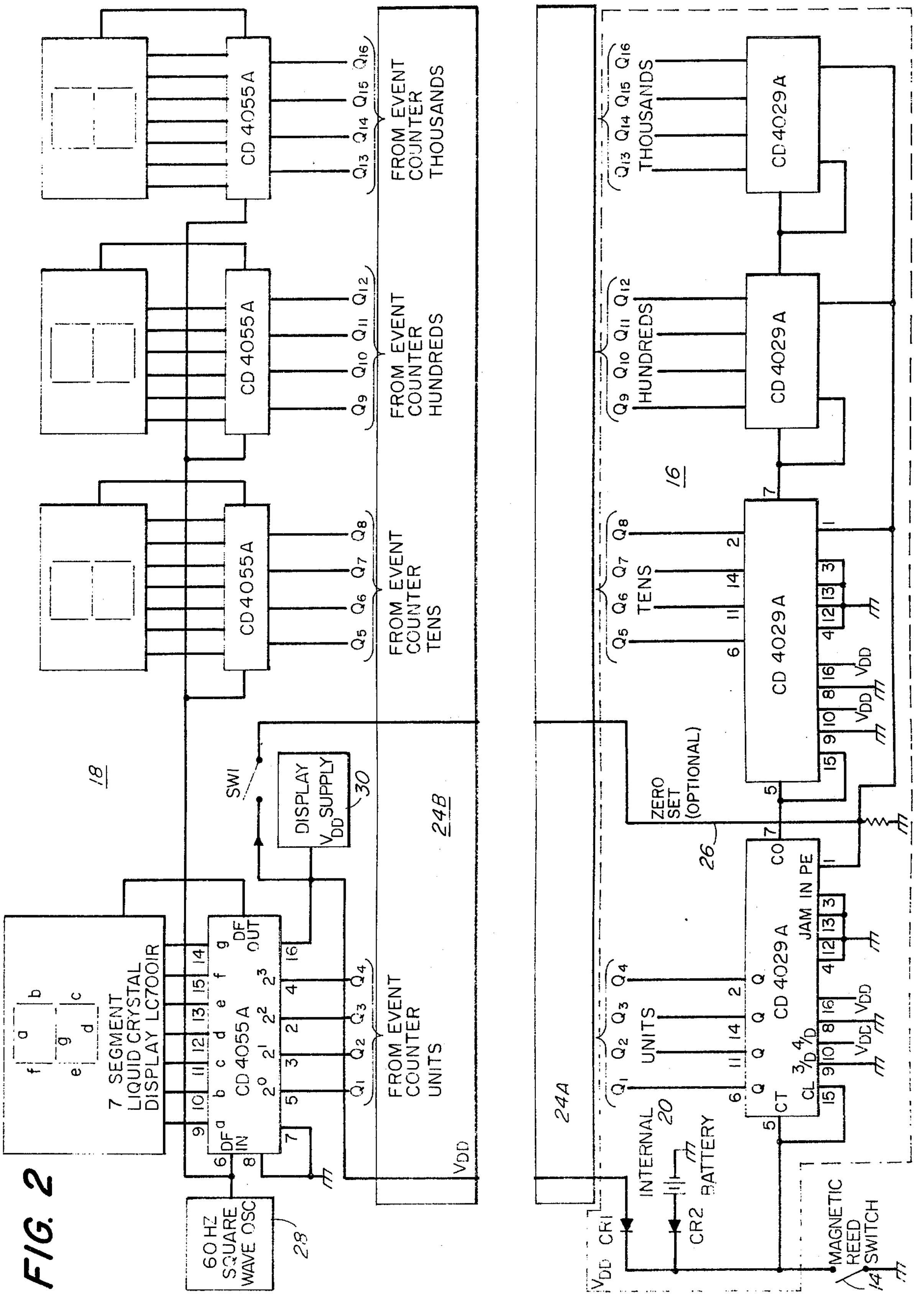
FIG. 2 is a schematic illustration of the event recorder and display unit of the preferred embodiment of the invention.

The preferred embodiment will be described in reference to a machine which has a shaft which rotates once every event or machine function cycle, which event it is desired to monitor or count. Referring to FIG. 1, a shaft 10 of the machine (not shown) has a magnet 12 secured thereto. A reed switch 14 is responsive to the position of the magnet 12. An event recorder 16 counts the signals from the switch 14. A display unit 18 when mated with the event recorder displays the count stored in the recorder.

Referring to FIG. 2, the recorder 16 and the counter 18 are shown in greater detail.

The event recorder 16 comprises a plurality of standard counters CD4029A identified as units, tens, hundreds, and thousands. The units and tens counters are shown in detail, it being understood that the hundreds and thousands units are similarly configured. The counters are four-bit BCD counters, and pin 9 on each of the counters is grounded while it functions as a BCD counter. If pin 9 were returned to $V_{dd}$, it would function as a binary counter. Pin 10 is returned to $V_{dd}$ to cause counter 14 to count up. Its jam inputs are returned to ground, so that when the zero reset line 26 is momentarily connected to $V_{dd}$ by switch SW-1, the counters are reset to zero. A battery 20, such as a standard 9V battery, provides the internal $V_{dd}$ supply for the operation of the event recorder 16.

For each shaft rotation, the opening of the magnetic reed switch 14 provides a signal which causes the counters to count up. Once the units counter has counted to its maximum, the tens counter will then commence to count, as is well understood. Diodes CR1 and CR2 allow an external $V_{dd}$ supply to pass from the battery 30 when the display unit 18 is connected to the counter to eliminate any possible interference from different supply voltages being used in the counter and the display simultaneously. The outputs $Q_1$–$Q_{16}$ from the counters are received in a connector **24*a***, such as a Amphenol No. 157-20240.

The display unit 18 comprises four BCD to seven-segment decoder drivers for the units, tens, hundreds, and thousands inputs, such as standard decoder drivers CD4055A. The tens decoder is shown in detail. The decoder drivers receive their input $Q'_1$–$Q'_{16}$ from the mating connector **24*b* when joined with the connector 24*a*, whereby the outputs from the counters are properly mated to the inputs of the decoders. Each of the decoders drives a seven-segment liquid crystal display such as LC7001R. A 60 hz square wave oscillator 28** provides an input to the decoder drivers and insures proper operation of the liquid crystal displays.

The external supply of higher voltage such as 15 volts from battery 30 is used to power both the event recorder 16 and the display unit 18 when the display is connected for reading. Thus, the present invention provides a counter which cannot be read until the mating display unit is secured thereto to provide a reading.

In an alternative embodiment of the invention the display units and counters through the connectors may be keyed to work correctly only with associated event recorders for privacy and thus security if desired. The connections between the display unit 18 and event recorder 16 may be scrambled. Thus, only a correctly wired mating connector or display unit will generate a correct display of the status of the counter. Either with or without the scrambled connectors, a special code may be devised for the counter which requires a specific decoder to be used in the display unit. As shown in FIG. 3, the status of the counter is used as the address for a read-only memory ROM 32. This encodes the information stored in the counters. The ROM 32 used with the preferred embodiment is a function of the number of events which must be recorded before the counters fill up and start over. In this embodiment there is one ROM 32 for all counters. Using the C-MOS technology for the counters, there is one address for each event number in the counters. The ROM 32 provides a 12-bit code output which will allow a count of up to 4096. If desired, other arbitrary codes of suitable length may be used. As in the preferred embodiment, to display the information stored in the counters the display unit 18 must be mated to the event counter 16, which is accomplished by joining the connectors 24*a* and *b*. When the display unit 18 is secured to the event recorder 16, the output code of the ROM 32 is used to address the decoder ROM 34. The ROM 34 then converts the information received from the ROM 32 to drive the drivers in the display unit 18 and the status of the counters is then displayed as before.

The event recorder has been described with a self-contained internal power supply. It should be noted that by using the self-contained power supply in the preferred embodiment, such as the battery, that the counters are powered at all times regardless of whether or not the machine is powered or functioning. An external supply may be used but the unit would then lend itself to tampering. Although described with a dual power supply, the power supply with the event recorder could be used to power the display unit if desired.

It should be understood that any arrangement may be used to generate a signal for the recorder, which signal has a relationship to the event to be counted. If the event corresponds to shaft rotation, as described above, an encoder or generator may be used to provide the signal. In coin-actuated machines, the signal generated by the coin falling through the chute may be employed. Alternatively, the signal which effects the machine function may be taken at full or partial strength. The term machine as used in this application includes any device which performs a function, which function it is desired to monitor. This would include meters, casting or injection machines, copying machines, etc.

Although a typical BCD recorder configuration of a specific length and configuration has been described, it is understood that the recorder can be of any arbitrary length and configuration and counters to count binary, hex, octal, BCD, gray code, biquinary, or other codes may be employed. Correspondingly, the display unit, which in essence is a portable circuit to plug into the event recorder providing access to the state of the counter, would assume a format corresponding to binary, decimal, or octal codes, etc.

Having described our invention, what we now claim is:

1. A recorder to count the number of events performed by a machine, which comprises in combination:

a. an event recorder which includes:

i. an interface circuit in electrical communication with the machine and adapted to provide a signal, which signal relates to an event performed by the machine;

ii. at least one digital counter in communication with the interface circuit to record the number of events;

iii. a first connector in communication with the counter; and iv. a first power supply to effect the transfer of the signal from the circuit and to power the counter, which first power supply is isolated from the machine;

b. a display unit which includes:

i. a second connector adapted to be removably mated with the first connector;

ii. at least one decoder;

iii. means to display digitally the decoded information which reflects the status of the counter; and iv. a second power supply disposed within the decoder to both power the counter to transfer the information stored therein and to drive the decoder in the display unit when the first and second connectors are mated.

2. The recorder of claim 1, which includes means secured to the counter to scramble the information transferred from the counter; and means disposed in the display unit to unscramble the information transferred from the counter.

3. The recorder of claim 1, wherein the counter includes a plurality of BCD serially connected counters.

4. The recorder of claim 1, wherein the means to display the decoded information includes a liquid crystal display.

5. The recorder of claim 1, wherein the means to display the decoded information is a liquid crystal display.

* * * * *